(12) United States Patent
Wu et al.

(10) Patent No.: US 9,912,437 B2
(45) Date of Patent: Mar. 6, 2018

(54) OPTICAL TRANSMITTERS

(71) Applicant: Finisar Corporation, Sunnyvale, CA (US)

(72) Inventors: Tao Wu, Union City, CA (US);
Hongyu Deng, Saratoga, CA (US);
Maziar Amirkiai, Sunnyvale, CA (US);
Shanshan Zeng, Sunnyvale, CA (US);
Tengda Du, San Jose, CA (US);
Yunpeng Song, Fremont, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/046,436

(22) Filed: Feb. 17, 2016

(65) Prior Publication Data

US 2016/0277140 A1    Sep. 22, 2016

Related U.S. Application Data

(60) Provisional application No. 62/135,551, filed on Mar. 19, 2015.

(51) Int. Cl.
*H04J 14/06* (2006.01)
*H04J 14/02* (2006.01)
*H04B 10/50* (2013.01)

(52) U.S. Cl.
CPC ............ *H04J 14/06* (2013.01); *H04B 10/506* (2013.01); *H04J 14/0221* (2013.01)

(58) Field of Classification Search
CPC .... H04J 14/06; H04J 14/0221; H04B 10/506; H04B 10/2569
USPC .................................................... 398/152, 65
See application file for complete search history.

(56) References Cited

U.S. PATENT DOCUMENTS

| | | | |
|---|---|---|---|
| 2005/0141829 A1* | 6/2005 | Narayan | G02B 6/4263 385/93 |
| 2008/0174769 A1* | 7/2008 | Weinert | G01M 11/33 356/73.1 |
| 2013/0148966 A1* | 6/2013 | Kurokawa | H04J 14/02 398/65 |
| 2015/0177526 A1* | 6/2015 | Zhang | G02B 27/14 359/638 |

* cited by examiner

*Primary Examiner* — M. R. Sedighian
(74) *Attorney, Agent, or Firm* — Maschoff Brennan

(57) ABSTRACT

An optical transmitter may include a transmit laser assembly configured to emit multiple light beams. The optical transmitter may additionally include an isolator configured to rotate a corresponding polarization state of each of the multiple light beams. The optical transmitter may additionally include a power multiplexing combiner configured to receive the multiple light beams from the isolator and combine the multiple light beams into a combined light beam. The optical transmitter may additionally include a lens configured to focus the combined light beam onto an optical fiber for transmission.

20 Claims, 13 Drawing Sheets

OPTICAL TRANSMITTERS

CROSS-REFERENCE TO RELATED APPLICATION

This application claims the benefit of and priority to U.S. Provisional Application No. 62/135,551, filed on Mar. 19, 2015, which is incorporated herein by reference.

FIELD

Some embodiments described herein generally relate to optical transmitters.

BACKGROUND

Unless otherwise indicated herein, the materials described herein are not prior art to the claims in the present application and are not admitted to be prior art by inclusion in this section.

A transmitter optical subassembly (TOSA) may be coupled to an optical fiber for transmitting a light beam through the optical fiber. In some applications, it may be a challenge to combine and transmit multiple light beams with different wavelengths through a single optical fiber.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to optical transmitters.

In an example embodiment, an optical transmitter may include a transmit laser assembly configured to emit multiple light beams. The optical transmitter may additionally include an isolator configured to rotate a corresponding polarization state of each of the multiple light beams. The optical transmitter may additionally include a power multiplexing combiner configured to receive the multiple light beams from the isolator and combine the multiple light beams into a combined light beam. The optical transmitter may additionally include a lens configured to focus the combined light beam onto an optical fiber for transmission.

In another example embodiment, the optical transmitter may include a laser array that may include multiple lasers configured to emit multiple light beams. Each of the multiple light beams may include a corresponding polarization state parallel to a laser top surface of the laser array. The optical transmitter may additionally include a mirror configured to redirect a propagation direction of the multiple light beams to be perpendicular to the laser top surface. The optical transmitter may additionally include a lens array configured to collimate the multiple light beams. The optical transmitter may additionally include a single stage isolator configured to rotate the corresponding polarization state of each of the multiple light beams. The optical transmitter may additionally include a power multiplexing combiner configured to receive the multiple light beams from the isolator and combine the multiple light beams into a combined light beam. The optical transmitter may additionally include a lens configured to focus the combined light beam onto an optical fiber for transmission.

In yet another example embodiment, a power multiplexing (PMUX) combiner configured to combine multiple light beams into a combined light beam is described. The PMUX combiner may include a first waveplate configured to rotate a first polarization state of a first light beam and a second polarization state of a second light beam to an S polarization. The PMUX combiner may additionally include a second waveplate configured to rotate a third polarization state of a third light beam and a fourth polarization state of a fourth light beam to a P polarization. The PMUX combiner may additionally include a first polarization beam splitter (PBS) configured to combine the first light beam with the third light beam to output a first intermediate combined light beam. The first PBS may also be configured to combine the second light beam with the fourth light beam to output a second intermediate combined light beam. The PMUX combiner may additionally include a third waveplate configured to rotate the first polarization state of the first light beam and the third polarization of the third light beam in the first intermediate combined light beam. The third waveplate may also be configured to rotate the second polarization polarization state of the fourth light beam in the second intermediate combined light beam. The PMUX combiner may additionally include a second PBS configured to combine the first intermediate combined light beam and the second intermediate combined light beam to output the combined light beam.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Embodiments described herein generally relate to optical transmitters.

Some embodiments described herein may include a high data rate optical transmitter assembled within a cylindrical can structure with a small form factor, such as a TO can. The utilization of the cylindrical can structure may reduce an assembly dimension of the optical transmitter, simplify an alignment process to assemble the optical transmitter, and reduce cost of the optical transmitter.

In some embodiments, the optical transmitter may integrate multiple lasers (e.g., coarse wavelength division multiplexing (CWDM) lasers, distributed feedback lasers (DFB), vertical cavity surface emitting lasers (VCSELs)) into a laser chip array with a pitch between 250 micrometers (μm) and 500 μm or a pitch with another suitable dimension. The multiple lasers may emit multiple light beams and the optical transmitter may use a PMUX combiner to combine the multiple light beams to a combined light beam. The optical transmitter may include a lens configured to focus the combined light beam onto an optical fiber for transmission. In these and other embodiments, the optical transmitter may have a reduced dimension and may be suitable for condensed package sizes or TOSA style package sizes.

In some embodiments, the optical transmitter may include a laser array, a mirror, a lens array, an isolator, a PMUX combiner, and a lens. The laser array may be attached to a ceramic carrier. The laser array may be configured to emit multiple light beams with a propagation direction parallel to a laser top surface. The mirror may be attached to the ceramic carrier and configured to redirect the propagation direction of the multiple light beams to be perpendicular to the laser top surface. The lens array may be configured to collimate the multiple light beams and the isolator may be configured to rotate a corresponding polarization state of each light beam. The PMUX combiner may be configured to combine the multiple light beams into a combined light beam. The lens may be configured to focus the combined light beam onto an optical fiber for transmission.

An example assembly process of the optical transmitter may include: mounting the laser array and the mirror on the ceramic carrier; aligning the lens array at X axis and Y axis and soldering a window cap on the ceramic carrier; aligning the PMUX combiner configured to receive light beams from the isolator and bonding the PMUX combiner on a sealing window with epoxy or another bonding material; attaching the lens to the PMUX combiner; and aligning a receptacle at X axis, Y axis, and Z axis and welding the receptacle to a housing configured to receive the receptacle.

Reference will now be made to the drawings to describe various aspects of some example embodiments of the invention. The drawings are diagrammatic and schematic representations of such example embodiments, and are not limiting of the present invention, nor are they necessarily drawn to scale.

Figure 1A:
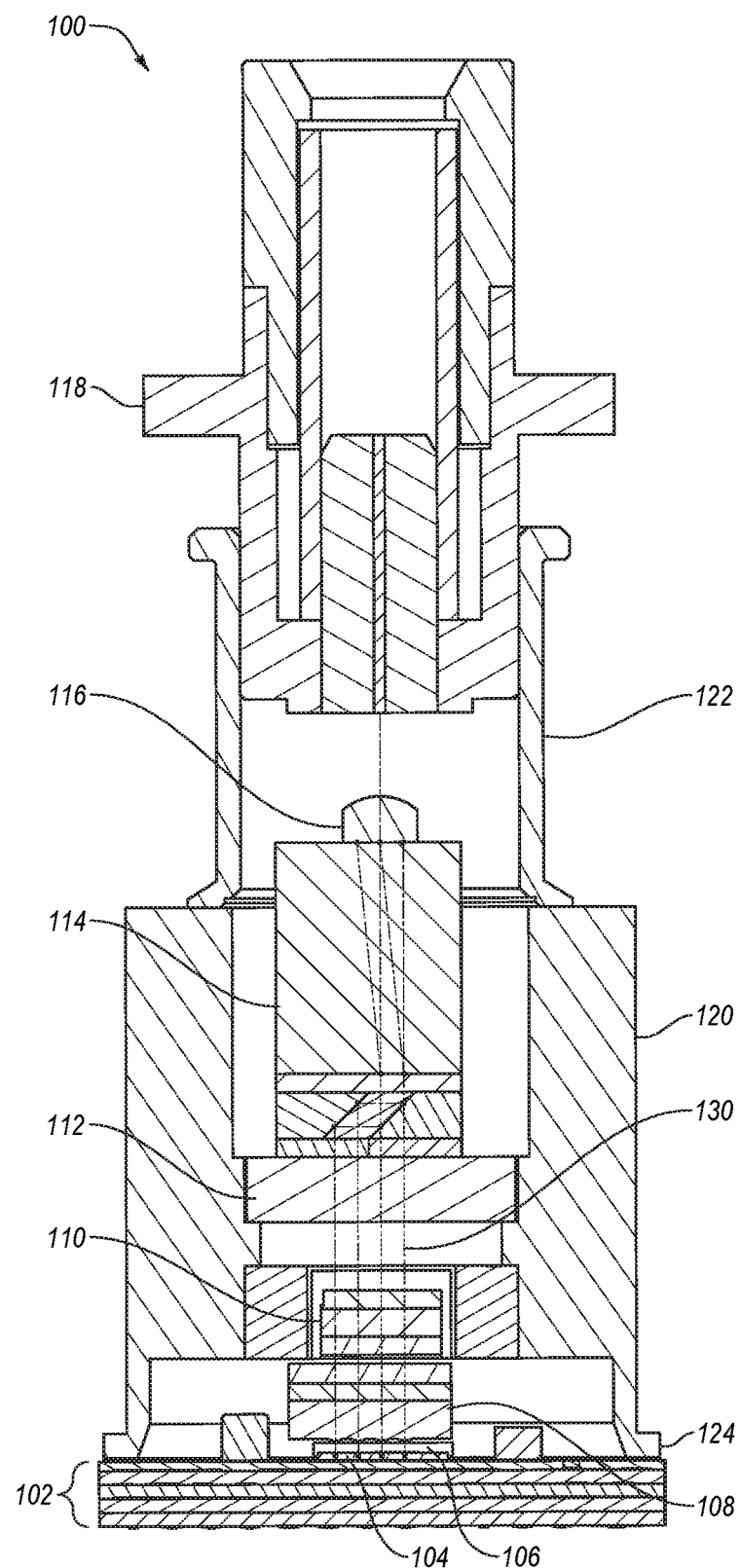
FIG. 1A is a cross-sectional view of an example optical transmitter.

FIG. 1A is a cross-sectional view of an example optical transmitter 100, arranged in accordance with at least some embodiments described herein. The optical transmitter 100 may include a multi-channel transmitter capable of transmitting data using multiple different wavelengths. In some embodiments, the optical transmitter 100 may be configured in a footprint of a quad small form-factor pluggable (QSFP) form factor or another suitable small form factor. In some embodiments, the optical transmitter 100 may include a transmitter with a TOSA style within a cylindrical can structure.

The optical transmitter 100 may include a ceramic carrier 102; a transmit laser assembly that includes a laser array 104, a mirror 106, and a lens array 108; an isolator 110; a sealing window 112; a PMUX combiner 114; a lens 116; a transmitter housing 120 with a window flange 124; a coupling housing 122; a receptacle 118; and any other components suitable for an optical transmitter.

Figure 3A:
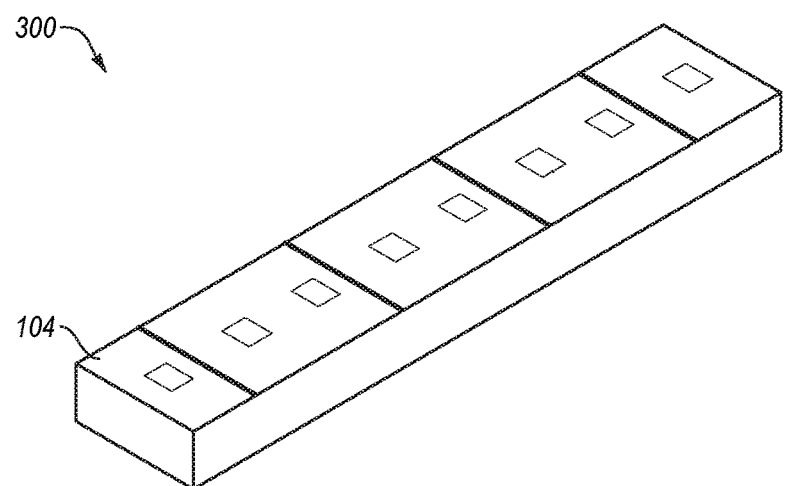
FIG. 3A is a perspective view of an example laser array.
Figure 3B:
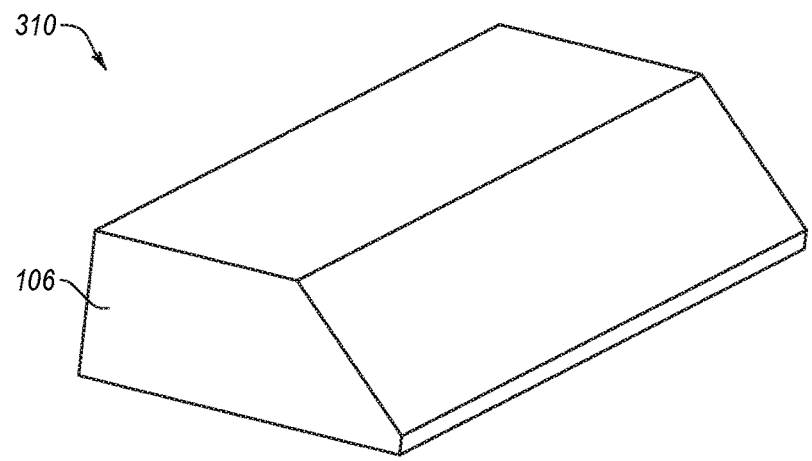
FIG. 3B is a perspective view of an example mirror.
Figure 3C:
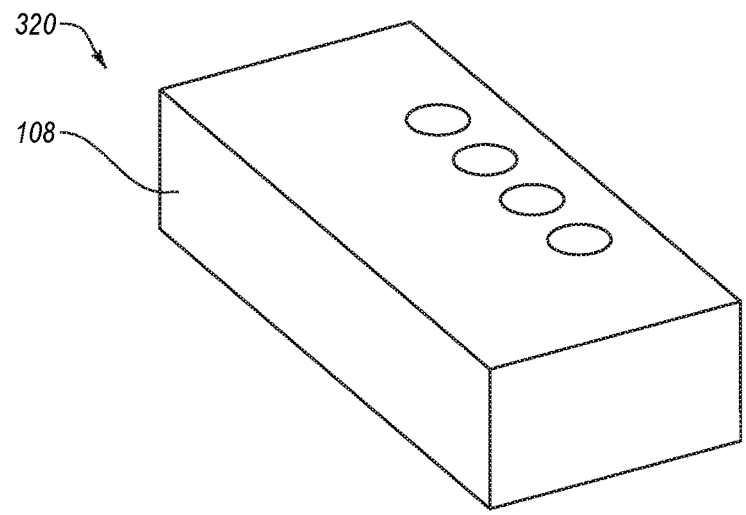
FIG. 3C is a perspective view of an example lens array.
Figure 3D:
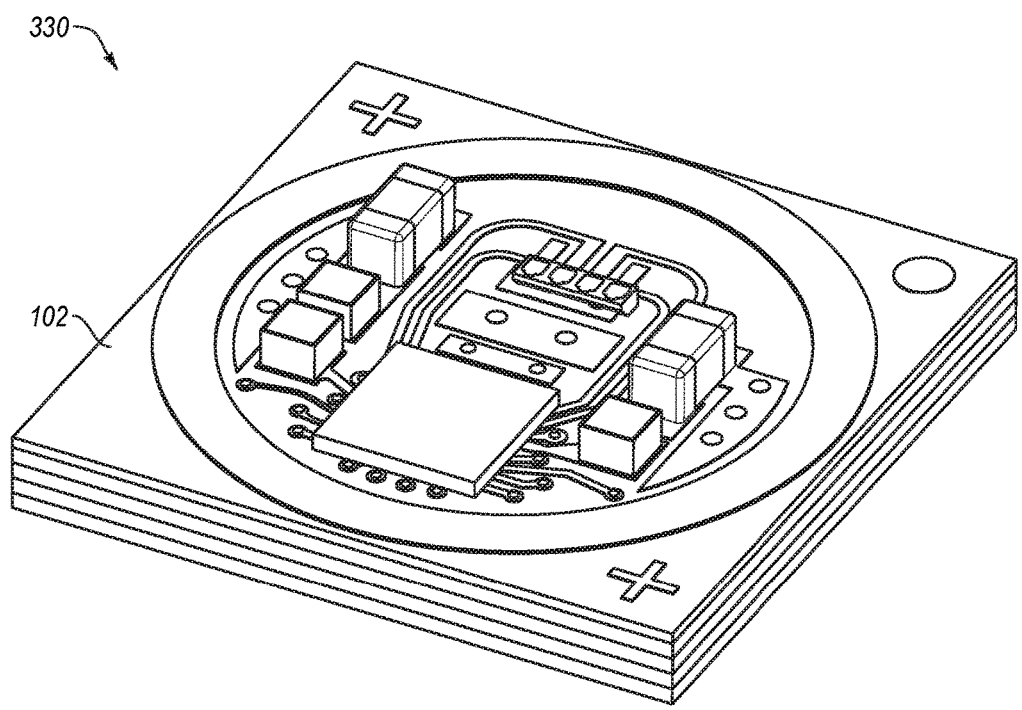
FIG. 3D is a perspective view of an example multi-layer ceramic carrier.

The ceramic carrier 102 may include high speed transmission lines for providing electrical couplings (or connections) to components of the optical transmitter 100. In some embodiments, the ceramic carrier 102 may include a multi-layer ceramic carrier. An example structure of the ceramic carrier 102 is illustrated in FIG. 3D.

The laser array 104 may be mounted on and/or attached to the ceramic carrier 102. The laser array 104 may include multiple lasers or laser diodes each configured to emit a light beam with a different wavelength so that multiple light beams may be emitted from the laser array 104. In some embodiments, the laser array 104 may include a VCSEL array or another suitable type of laser array that may emit multiple light beams with a propagation direction perpendicular to a laser top surface of the laser array 104. Alternatively, the laser array 104 may include a DFB array, a CWDM laser array, or another suitable type of laser array that may emit multiple light beams with a propagation direction parallel to the laser top surface. Example propagation paths for the multiple light beams that may travel through the optical transmitter 100 are illustrated using dashed-dotted lines 130.

The multiple lasers or laser diodes in the laser array 104 may be integrated into a laser chip array with a pitch between 250 μm and 500 μm or a pitch with another suitable dimension. For example, the laser array 104 may include four different CWDM lasers integrated into a laser chip array with a pitch between 250 μm and 500 μm. The four CWDM lasers may emit four light beams with wavelengths of 1270 nanometers (nm), 1290 nm, 1310 nm, and 1330 nm, respectively. An example structure of the laser array 104 is illustrated in FIG. 3A.

The mirror 106 may be mounted on and/or attached to the ceramic carrier 102. In some embodiments, the multiple light beams emitted from the laser array 104 may have a propagation direction parallel to the laser top surface. The mirror 106 may be configured to reflect the multiple light beams so that the propagation direction of the multiple light beams may be redirected by 90° or another suitable angle to be perpendicular to the laser top surface. For example, the mirror 106 may be configured to redirect the propagation direction of the multiple light beams to be orthogonal to the laser top surface. An example structure of the mirror 106 is illustrated in FIG. 3B.

Figure 2A:
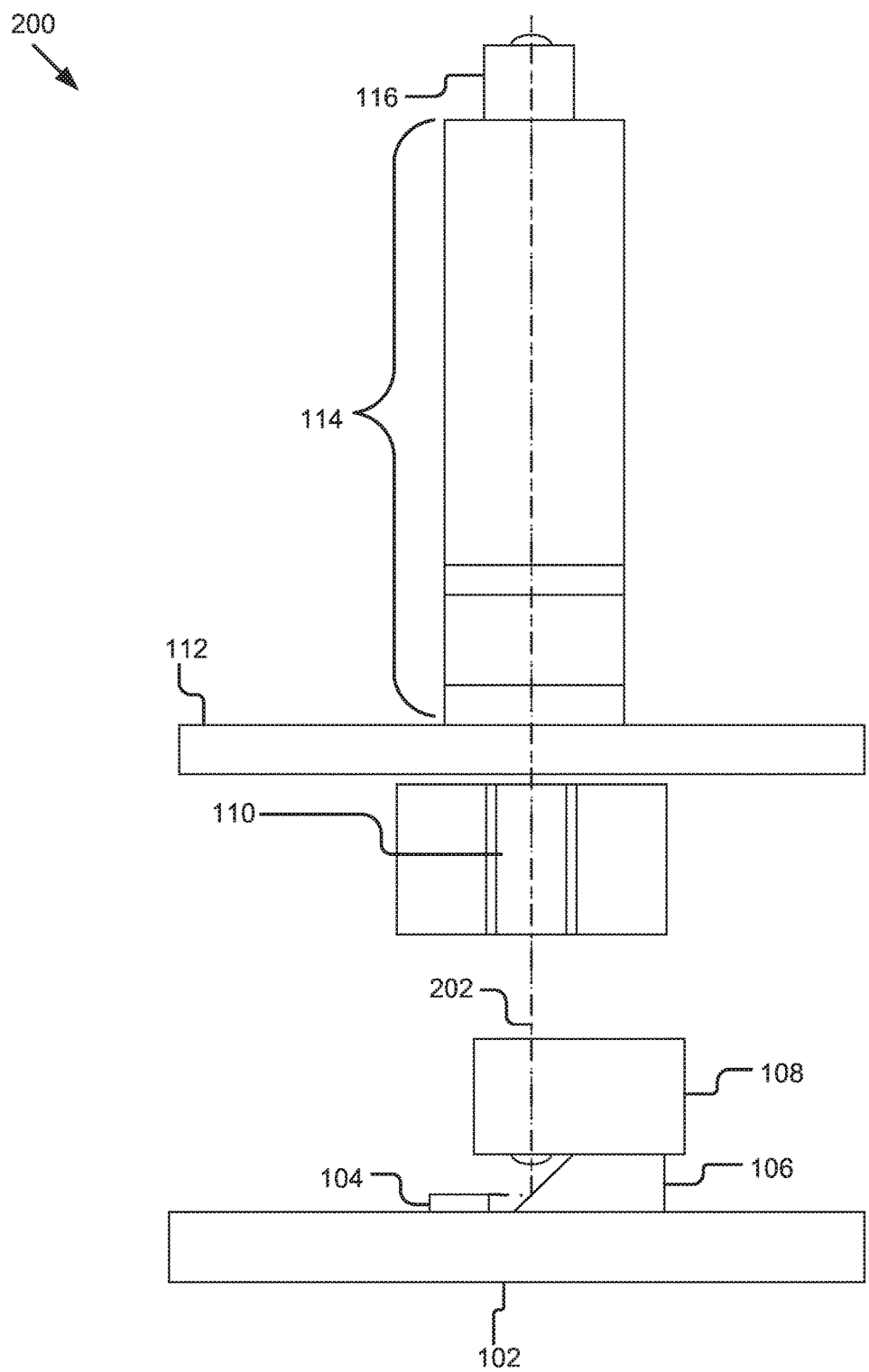
FIG. 2A is a graphic representation that illustrates first example optical couplings between components of the optical transmitter of FIG. 1A.
Figure 2B:
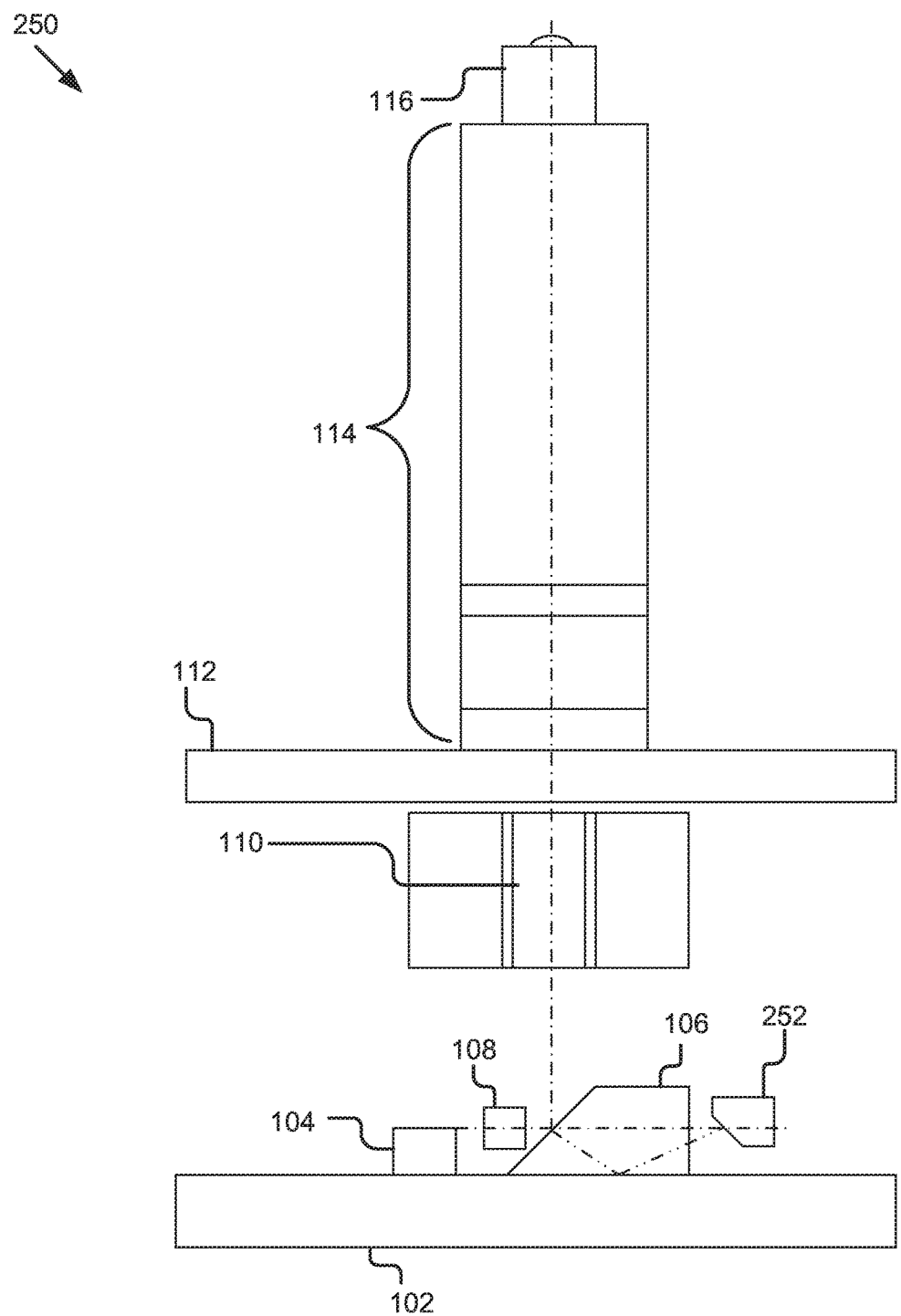
FIG. 2B is a graphic representation that illustrates second example optical couplings between components of the optical transmitter of FIG. 1A.

The lens array 108 may be configured to collimate the multiple light beams. The lens array 108 may include multiple lenses. An example structure of the lens array 108 is illustrated in FIG. 3C. In some embodiments, the lens array 108 may be optically coupled to the mirror 106 and configured to collimate the multiple light beams reflected by the mirror 106, as illustrated in FIG. 2A. Thus, the light beams emitted from the laser array 104 may propagate to the mirror 106, through the lens array 108, and through the isolator 110 in sequence. Alternatively, the lens array 108 may be optically coupled between the laser array 104 and the mirror 106. The lens array 108 may be configured to collimate the multiple light beams emitted from the laser array 104 before the multiple light beams are reflected by the mirror 106, as illustrated in FIG. 2B. Thus, the light beams emitted from the laser array 104 may propagate through the lens array 108, to the mirror 106, and through the isolator 110 in sequence.

Alternatively, the lens array 108 may be optically coupled to the laser array 104 and the isolator 110. The laser array 104 may emit multiple light beams with a propagation direction perpendicular to the laser top surface so that there is no need to include a mirror to redirect the propagation direction of the multiple light beams. The lens array 108 may be configured to collimate the multiple light beams emitted from the laser array 104. Thus, the light beams emitted from the laser array 104 may propagate through the lens array 108 and the isolator 110 in sequence.

Figure 4:
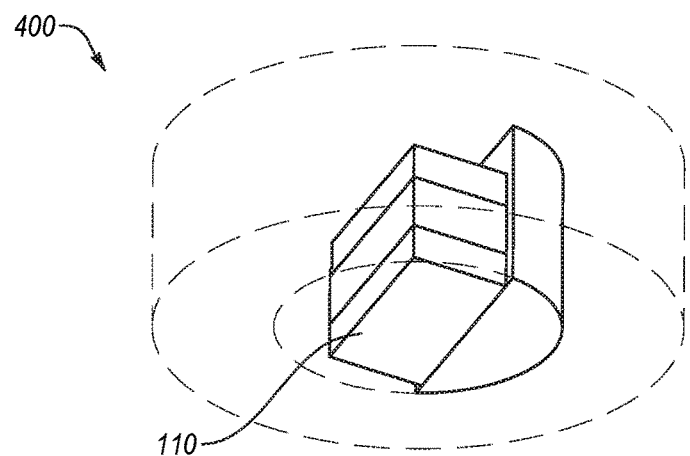
FIG. 4 is a perspective view of an example isolator.

The isolator 110 may be configured to rotate polarization states of the multiple light beams. For example, each of the multiple light beams may have a corresponding polarization state parallel to the laser top surface before entering the isolator 110. The isolator 110 may rotate a corresponding polarization state of each light beam that propagates through the isolator 110 by 45° or another suitable angle. In some embodiments, the isolator 110 may include a single stage isolator. An example structure of the isolator 110 is illustrated in FIG. 4.

The PMUX combiner 114 may be configured to receive the multiple light beams from the isolator 110. The PMUX combiner 114 may be configured to combine the multiple light beams into a combined light beam. The PMUX combiner 114 may be bonded to, attached to, and/or mounted on the sealing window 112. The PMUX combiner 114 is described in more detail below with reference to FIGS. 7A-7E.

Figure 6:
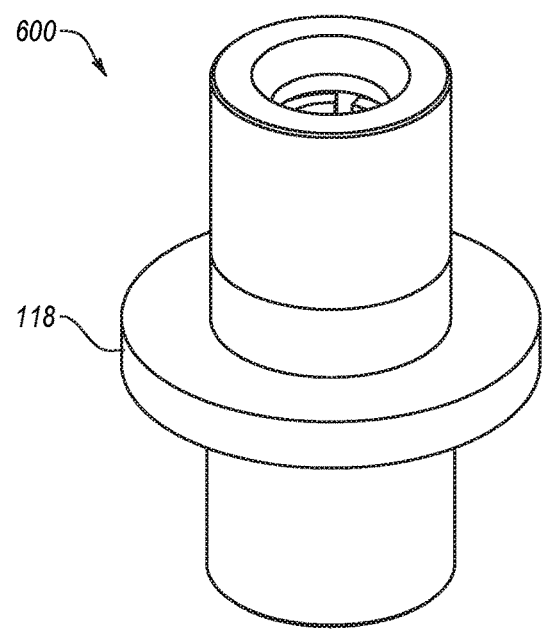
FIG. 6 is a perspective view of an example receptacle.

The lens 116 may be optically coupled to the PMUX combiner 114. The lens 116 may be configured to focus the combined light beam from the PMUX combiner 114 onto an optical fiber within the receptacle 118. An example structure of the lens 116 is illustrated in FIG. 6.

The transmitter housing 120 may be attached to, bonded to, and/or mounted on the ceramic carrier 102 via the window flange 124. The transmitter housing 120 may be configured to house the transmit laser assembly that may include the laser array 104, the lens array 108, and/or the mirror 106; the sealing window 112; at least part of the PMUX combiner 114; and any other suitable components of the optical transmitter 100. The transmitter housing 120 may have a cylindrical can structure.

The coupling housing 122 may be attached to, bonded to, and/or mounted on the transmitter housing 120. The coupling housing 122 may be configured to receive the receptacle 118.

The receptacle 118 may be configured to receive a connector that may optically couple the optical transmitter 100 to an optical link. For example, the receptacle 118 may be configured to receive a connector so that an optical fiber in the connector may be optically coupled to the lens 116, allowing the combined light beam to propagate from the lens 116 to the optical fiber. The receptacle 118 may include a lucent connector/ultra physical contact (LC/UPC) receptacle. An example structure of the receptacle 118 is illustrated in FIG. 6.

Figure 1B:
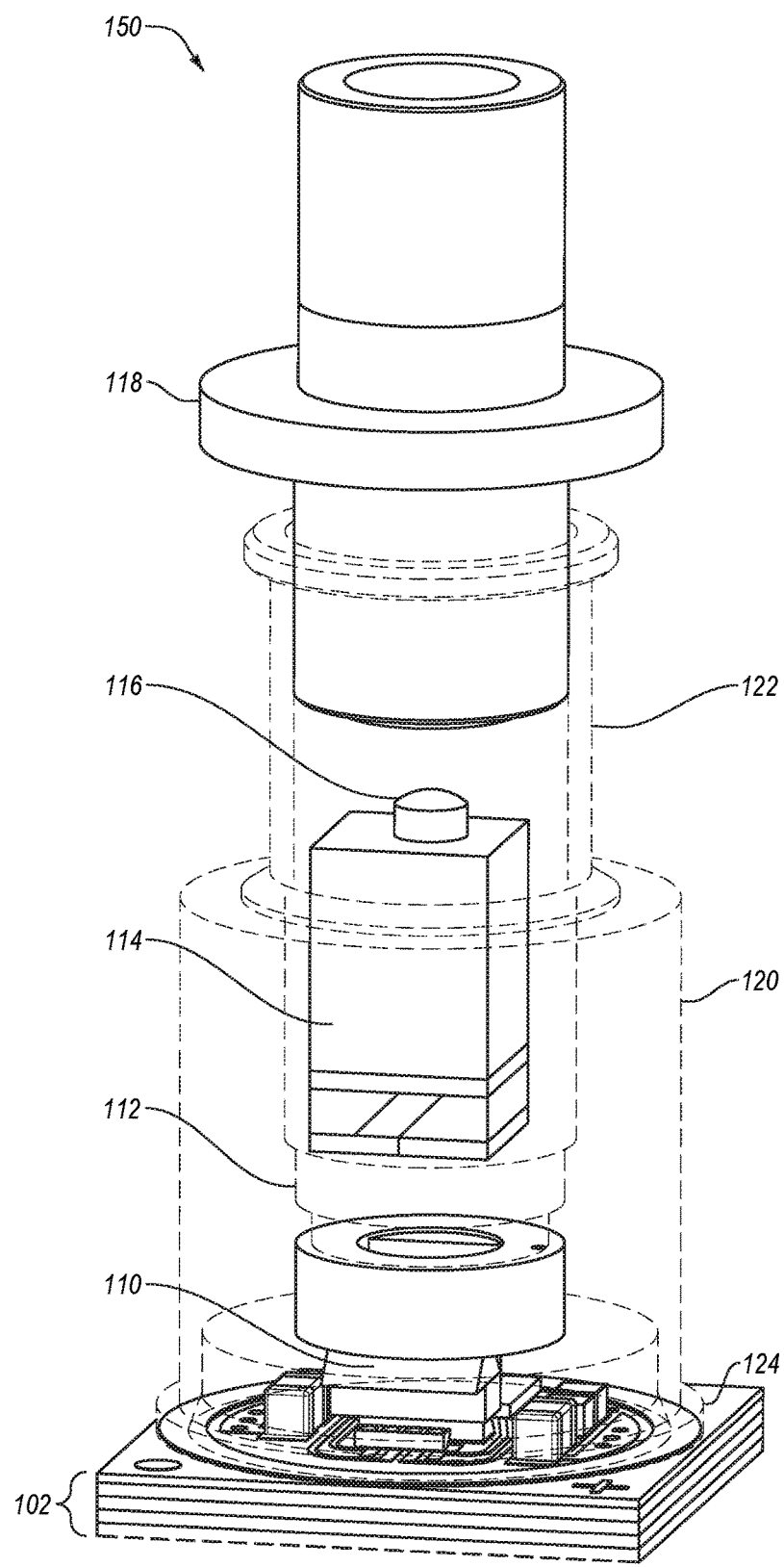
FIG. 1B is a perspective view of the example optical transmitter of FIG. 1A.

FIG. 1B is a perspective view 150 of the example optical transmitter 100 of FIG. 1A, arranged in accordance with at least some embodiments described herein. The transmitter housing 120, the sealing window 112, and the coupling housing 122 are illustrated in FIG. 1B to be transparent and are marked with dashed lines to allow other components of the optical transmitter 100 to be seen in FIG. 1B. However, the transmitter housing 120, the sealing window 112, and the coupling housing 122 may be made of non-transparent material.

Figure 1C:
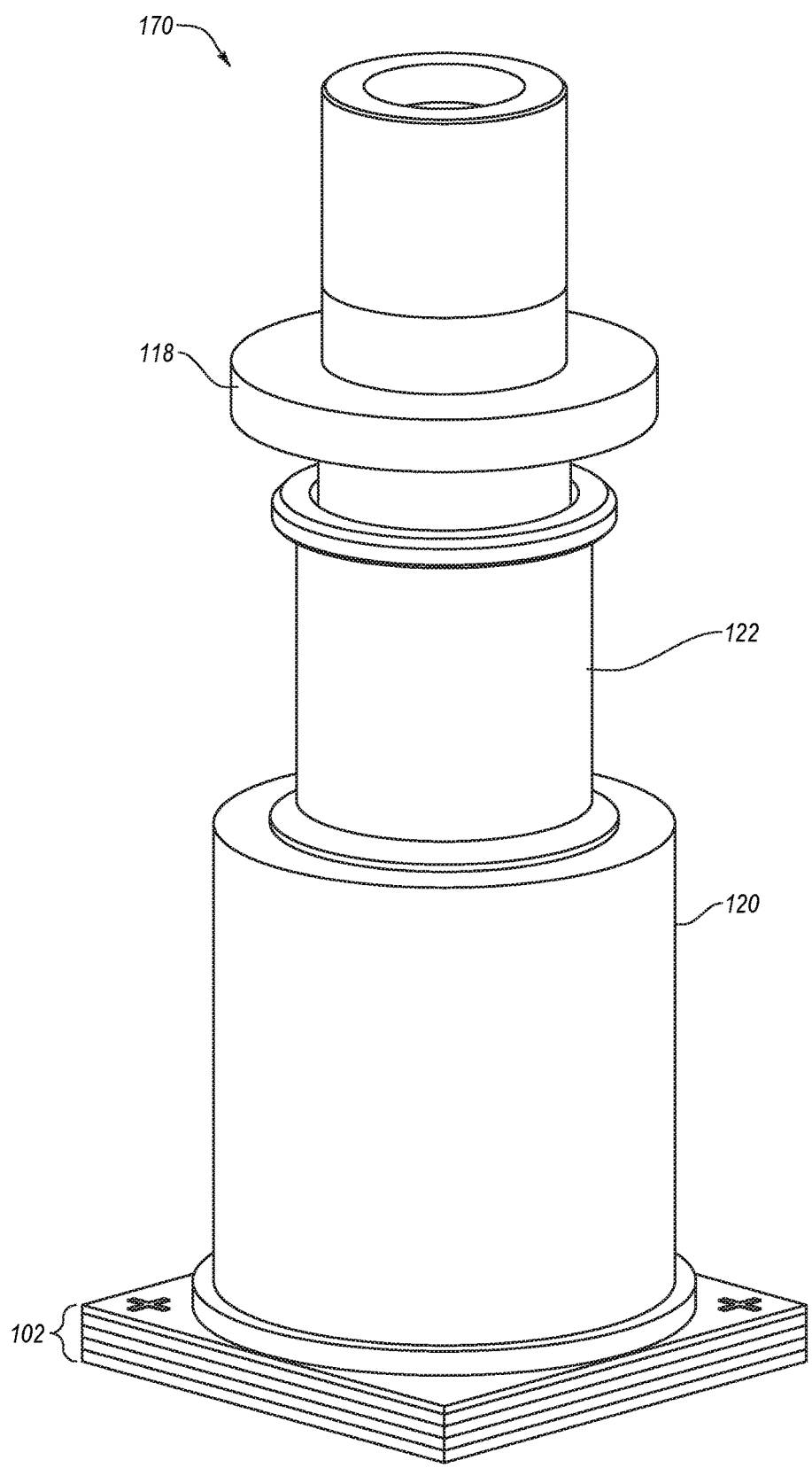
FIG. 1C is another perspective view of the example optical transmitter of FIG. 1A.

FIG. 1C is another perspective view 170 of the example optical transmitter 100 of FIG. 1A, arranged in accordance with at least some embodiments described herein. The perspective view 170 illustrates an exterior view of the ceramic carrier 102, the transmitter housing 120, the coupling housing 122, and the receptacle 118 of the optical transmitter 100 of FIG. 1A.

FIG. 2A is a graphic representation 200 that illustrates first example optical couplings between components of the optical transmitter 100 of FIG. 1A, arranged in accordance with at least some embodiments described herein. A propagation path 202 through which multiple light beams may travel through the optical transmitter 100 of FIG. 1A is illustrated with dashed-dotted lines. The laser array 104 may emit the multiple light beams with different wavelengths. Initially, a corresponding polarization state of each light beam may be parallel to a laser top surface of the laser array 104. A propagation direction of the multiple light beams may also be parallel to the laser top surface. The multiple light beams may propagate to the mirror 106. The mirror 106 may be configured to redirect the propagation direction of the multiple light beams upward by 90° or another suitable angle so that the redirected propagation direction may be perpendicular to the laser top surface.

Next, the multiple light beams may propagate through the lens array 108, the isolator 110, the sealing window 112, and the PMUX combiner 114. The lens array 108 may collimate the multiple light beams. The isolator 110 may rotate a corresponding polarization state of each of the multiple light beams by 45° or another suitable angle. The PMUX combiner may combine the multiple light beams into a combined light beam. The lens 116 may focus the combined light beam onto an optical fiber within the receptacle 118 (FIGS. 1A-1C) for transmitting the combined light beam through the optical fiber.

FIG. 2B is a graphic representation 250 that illustrates second example optical couplings between components of the optical transmitter 100 of FIG. 1A, arranged in accordance with at least some embodiments described herein. Propagation paths through which multiple light beams may travel through the optical transmitter 100 of FIG. 1A are illustrated with dashed-dotted lines. The laser array 104 may emit the multiple light beams with different wavelengths. Initially, a corresponding polarization state of each light beam may be parallel to a laser top surface of the laser array 104. A propagation direction of the multiple light beams may also be parallel to the laser top surface. The multiple light beams may propagate to the lens array 108. The lens array 108 may include a micro-lens array. The lens array 108 may collimate the multiple light beams.

Next, the multiple light beams may propagate to the mirror 106. The mirror 106 may be configured to redirect the propagation direction of the multiple light beams upward by 90° or another suitable angle so that the redirected propagation direction may be perpendicular to the laser top surface. For each light beam, at least part of the corresponding light beam may be reflected by the mirror 106 and then continue to propagate in a propagation direction perpendicular to the laser top surface. A remaining part of each light beam may propagate through the mirror 106 and may be detected by a monitoring photodiode 252. The monitoring photodiode 252 may be included in a photodiode array that includes a different monitoring photodiode 252 for each of multiple light beams.

The multiple light beams may continue to propagate through the isolator 110, the sealing window 112, and the PMUX combiner 114 after reflection by the mirror 106. The isolator 110 may rotate a corresponding polarization state of each of the multiple light beams by 45° or another suitable angle. The PMUX combiner 114 may combine the multiple light beams into a combined light beam. The lens 116 may focus the combined light beam onto an optical fiber within the receptacle 118 (FIGS. 1A-1C) for transmitting the combined light beam through the optical fiber.

FIG. 3A is a perspective view 300 of the laser array 104 in the optical transmitter 100 of FIG. 1A, arranged in accordance with at least some embodiments described herein. The laser array 104 may include a DFB laser array, a CWDM laser array, a VCSEL laser array, or another suitable type of laser array.

FIG. 3B is a perspective view 310 of the mirror 106 in the optical transmitter 100 of FIG. 1A, arranged in accordance with at least some embodiments described herein.

FIG. 3C is a perspective view 320 of the lens array 108 in the optical transmitter 100 of FIG. 1A, arranged in accordance with at least some embodiments described herein. The lens array 108 may include one or more lenses (e.g., four lenses or another suitable number of lenses). In some embodiments, a number of lenses included in the lens array 108 may be the same as a number of light beams emitted by the laser array 104 so that each lens may be configured to collimate one light beam.

FIG. 3D is a perspective view 330 of the ceramic carrier 102 in the optical transmitter 100 of FIG. 1A, arranged in accordance with at least some embodiments described herein. The ceramic carrier 102 may include a multi-layer ceramic carrier.

Figure 3E:
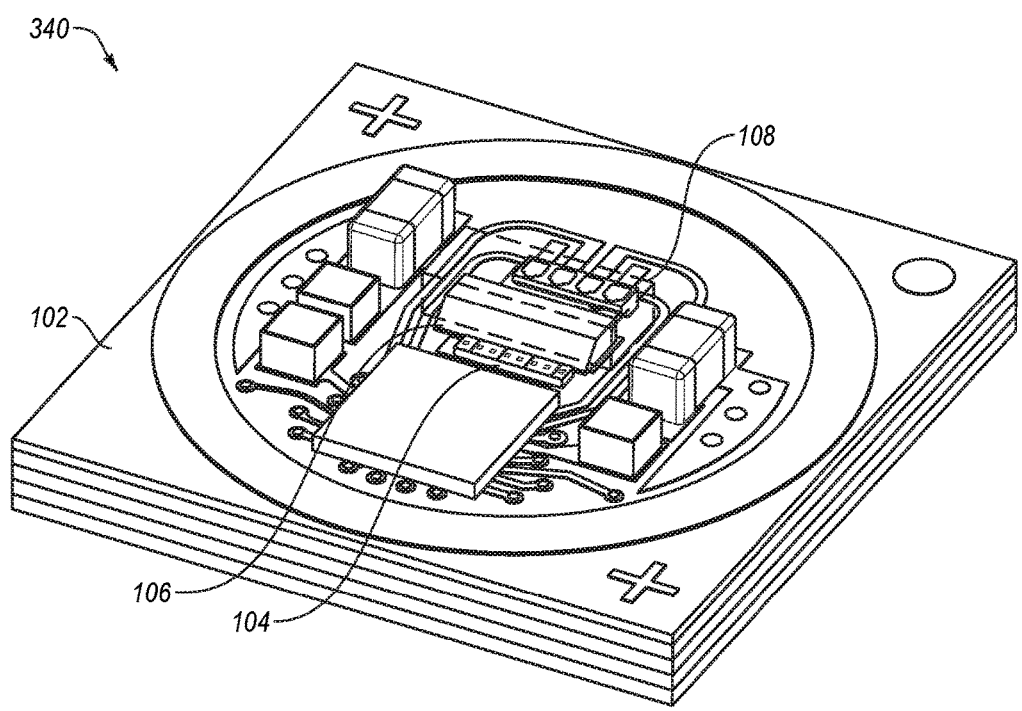
FIG. 3E is a perspective view of an example transmit laser assembly that includes the laser array of FIG. 3A, the mirror of FIG. 3B, the lens array of FIG. 3C, and the multi-layer ceramic carrier of the FIG. 3D.

FIG. 3E is a perspective view 340 of the transmit laser assembly that includes the ceramic carrier 102 of FIG. 3D assembled with the laser array 104 of FIG. 3A, the mirror 106 of FIG. 3B, and the lens array 108 of FIG. 3C, arranged in accordance with at least some embodiments described herein. The lens array 108 is illustrated to be transparent and marked with dashed lines in FIG. 3E. Alternatively, the lens array 108 may be non-transparent.

FIG. 4 is a perspective view 400 of the isolator 110 in the optical transmitter 100 of FIG. 1A, arranged in accordance with at least some embodiments described herein. The isolator 110 may include a single stag isolator.

Figure 5:
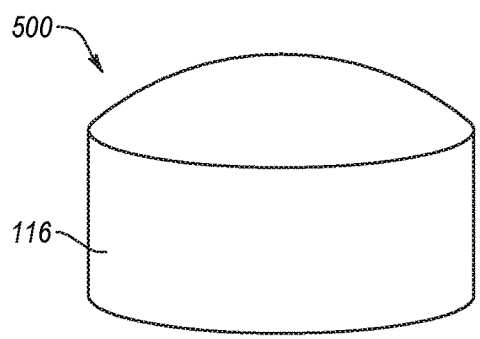
FIG. 5 is a perspective view of an example lens.

FIG. 5 is a perspective view 500 of the lens 116 in the optical transmitter 100 of FIG. 1A, arranged in accordance with at least some embodiments described herein.

FIG. 6 is a perspective view 600 of the receptacle 118 in the optical transmitter 100 of FIG. 1A, arranged in accordance with at least some embodiments described herein.

Figure 7A:
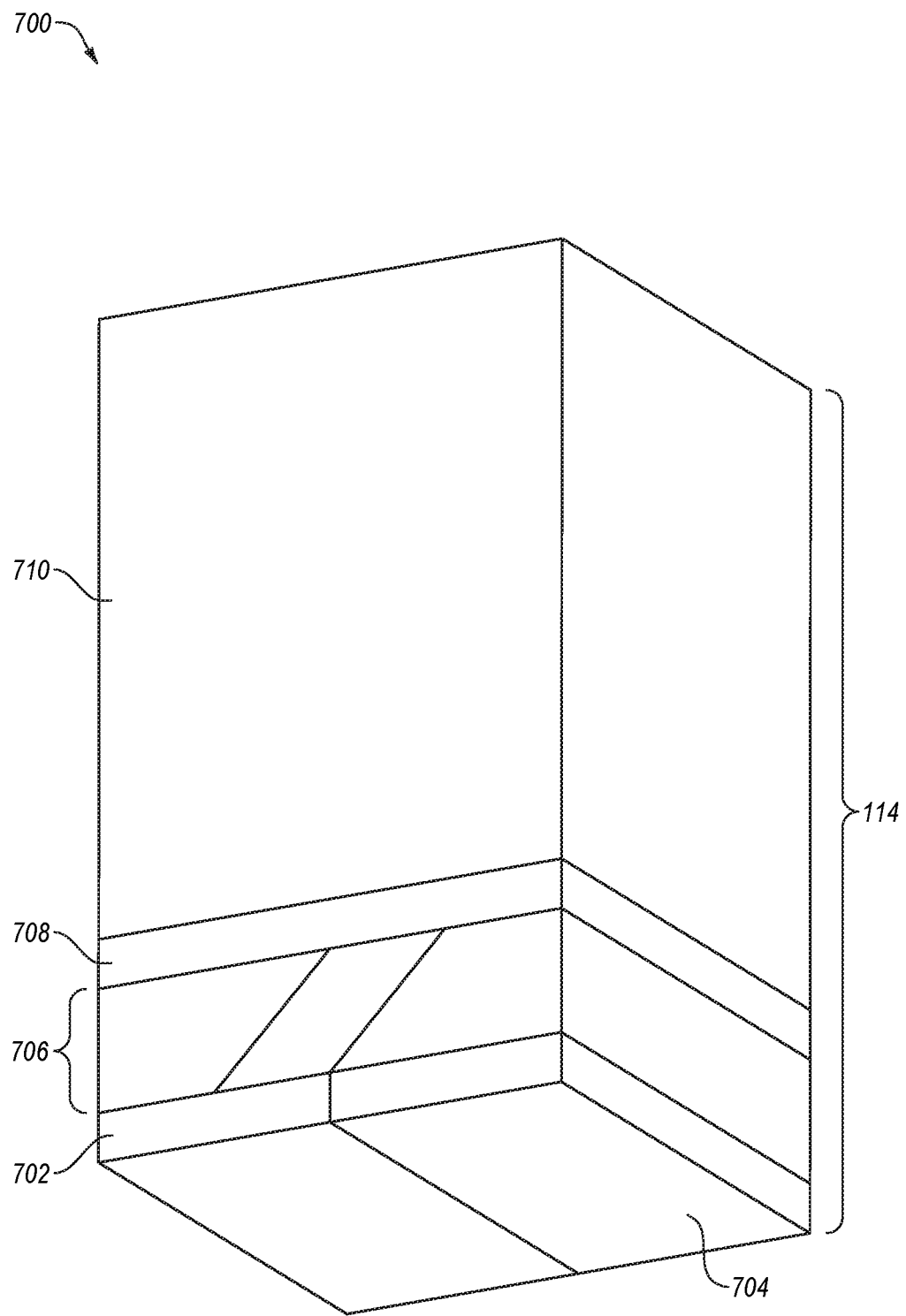
FIG. 7A is a perspective view of an example power multiplexing (PMUX) combiner.

FIG. 7A is a perspective view 700 of the PMUX combiner 114 in the optical transmitter 100 of FIG. 1A, arranged in accordance with at least some embodiments described herein. In some embodiments, the PMUX combiner 114 may include a first polarization shifting assembly, a first polarization beam splitter (PBS) 706, a second polarization shifting assembly, and a second PBS 710. The first polarization shifting assembly may include a first waveplate 702 and a second waveplate 704. Alternatively or additionally, the first polarization shifting assembly may include other optical components or devices configured to shift polarization states of light beams. The second polarization shifting assembly may include a third waveplate 708. Alternatively or additionally, the second polarization shifting assembly may include other optical components or devices configured to shift polarization states of light beams.

Figure 7B:
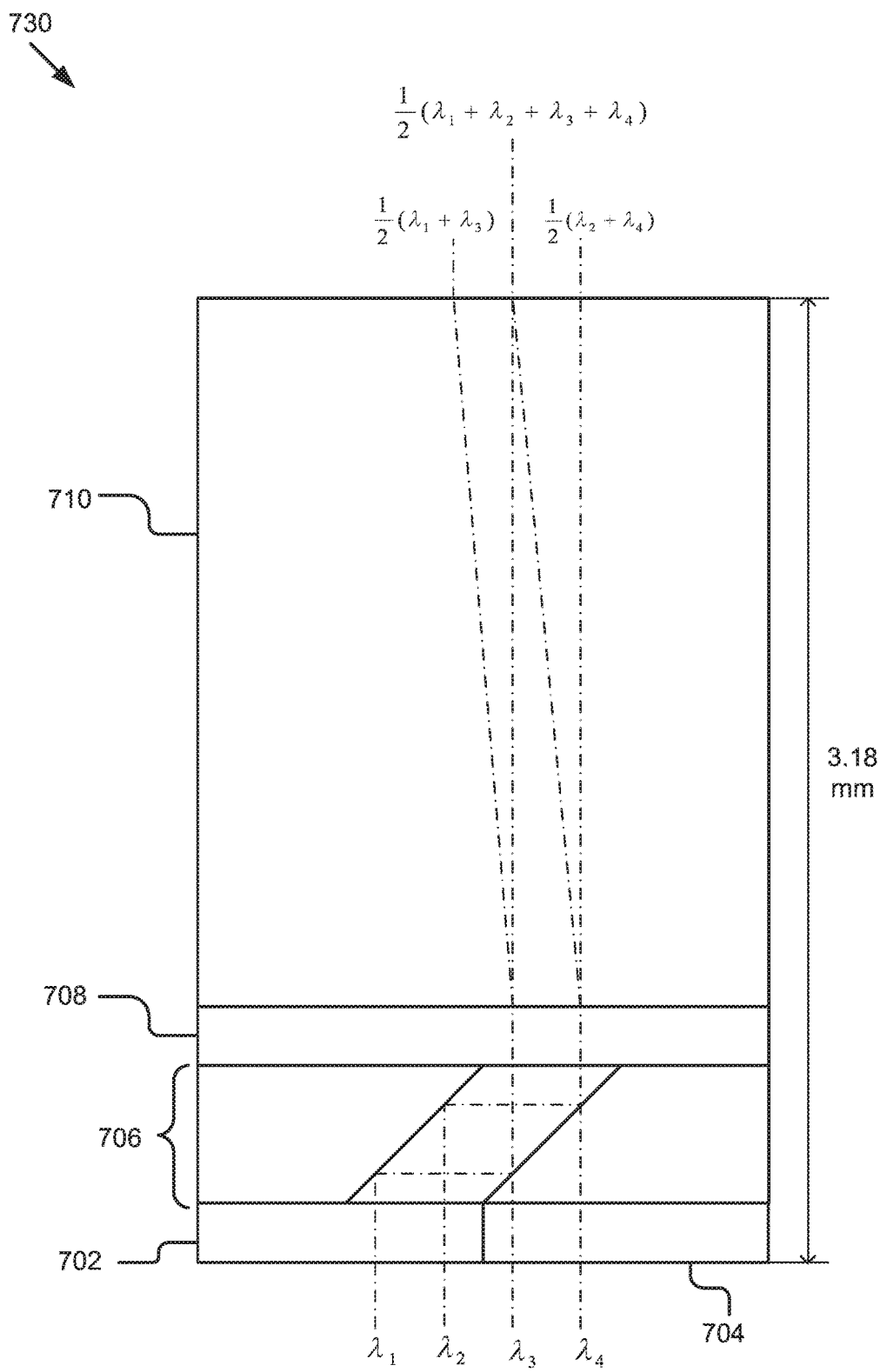
FIG. 7B is a graphic representation that illustrates example propagation paths of light beams that propagate through the PMUX combiner of FIG. 7A.

FIG. 7B is a graphic representation 730 that illustrates example propagation paths of light beams that propagate through the PMUX combiner 114 of FIG. 7A, arranged in accordance with at least some embodiments described herein. The PMUX combiner 114 may have a dimension of 2 millimeters (mm)×2 mm×3.18 mm, with a total thickness of 3.18 mm. Alternatively, the PMUX combiner 114 may have other suitable dimensions. In the PMUX combiner 114, the first waveplate 702 and the second waveplate 704 may be optically coupled to the first PBS 706, the first PBS 706 may be optically coupled to the third waveplate 708, and the third waveplate 708 may be optically coupled to the second PBS 710.

The PMUX combiner 114 may be configured to combine four light beams together to output a combined light beam. The four light beams may include a first light beam with a wavelength $\lambda 1$ (e.g., $\lambda 1=1270$ μm), a second light beam with a wavelength k2 (e.g., $\lambda 2=1290$ μm), a third light beam with a wavelength $\lambda 3$ (e.g., $\lambda 3=1310$ μm), and a fourth light beam with a wavelength $\lambda 4$ (e.g., $\lambda 4=1330$ μm). The combined light beam may include a light beam represented by $(\lambda 1+\lambda 2+\lambda 3+\lambda 4)/2$, which is a sum of half of the first light beam, half of the second light beam, half of the third light beam, and half the fourth light beam.

Propagation paths of the four light beams are illustrated with dashed-dotted lines. Detailed propagation of the four light beams through the first polarization shifting assembly (e.g., the waveplates 702 and 704) and the first PBS 706 is illustrated in FIG. 7C, detailed propagation of the four light beams through the third waveplate 708 is illustrated in FIG. 7D, and detailed propagation of the four light beams through the second PBS 710 is illustrated in FIG. 7E.

Figure 7C:
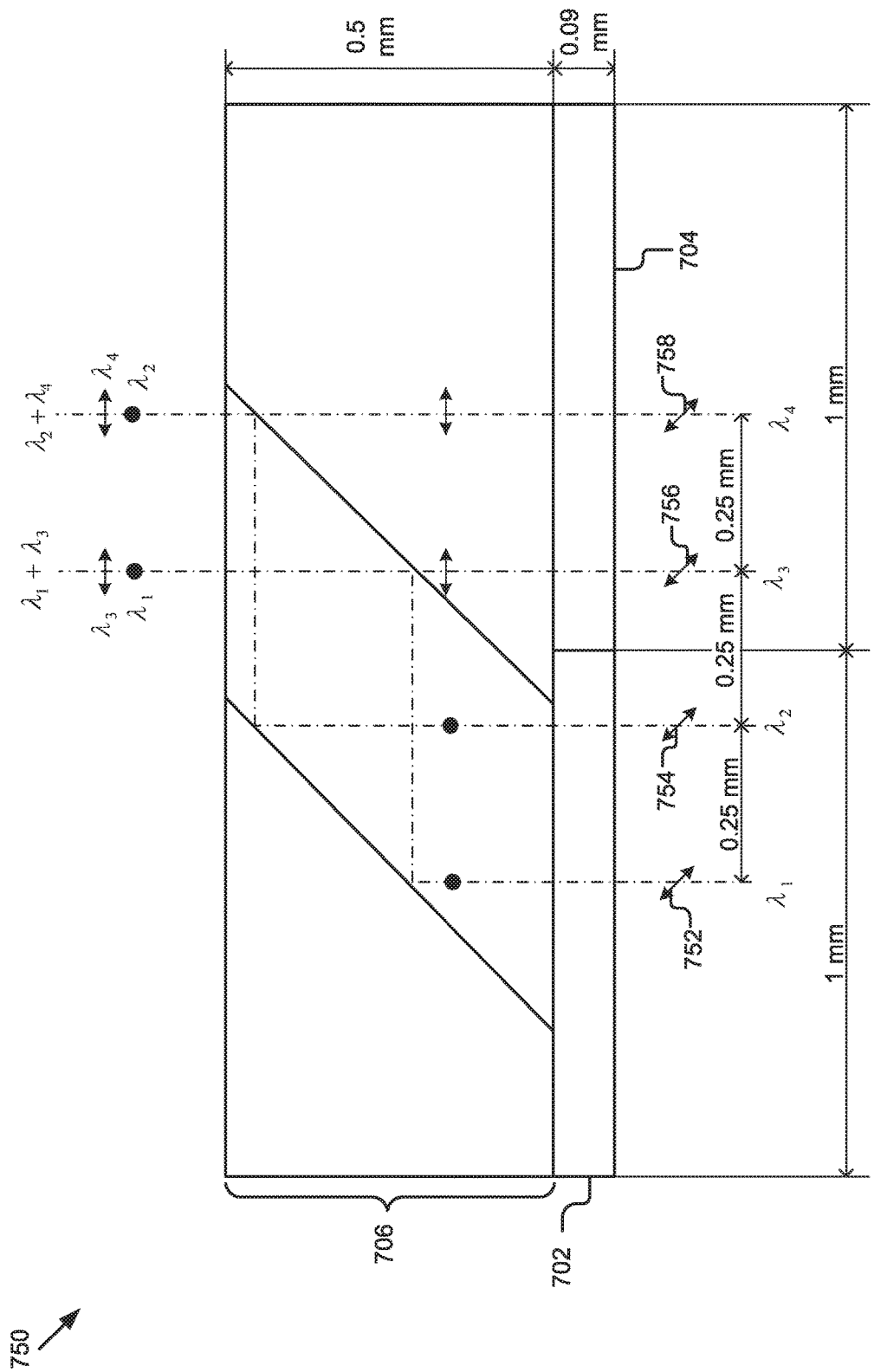
FIG. 7C is a graphic representation that illustrates example propagation paths of light beams that propagate through a first polarization shifting assembly and a first polarization beam splitter (PBS) of the PMUX combiner of FIG. 7A.
Figure 7D:
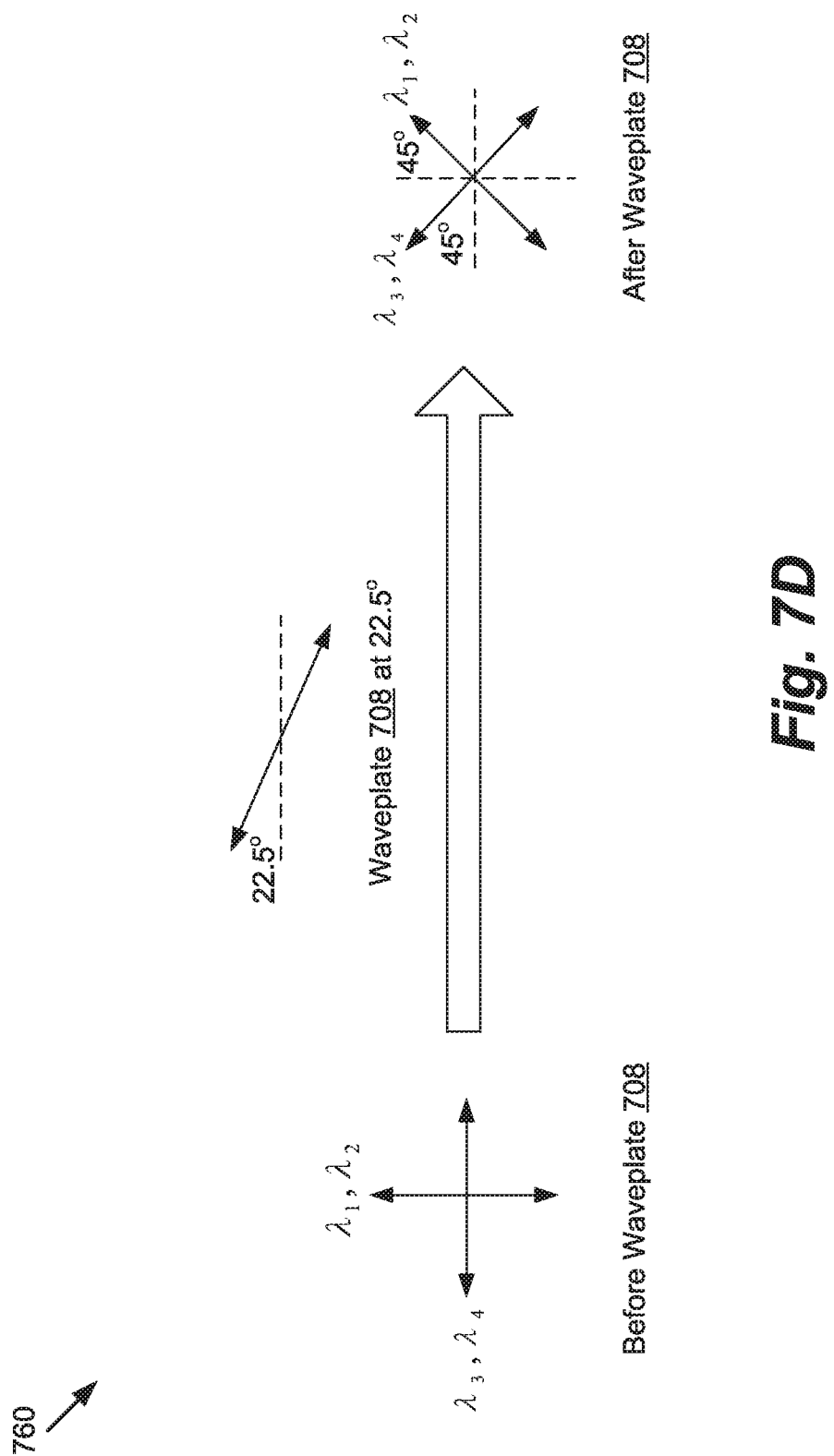
FIG. 7D is a graphic representation that illustrates example polarization states of the light beams of FIG. 7C that propagate through a second polarization shifting assembly of the PMUX combiner of FIG. 7A.
Figure 7E:
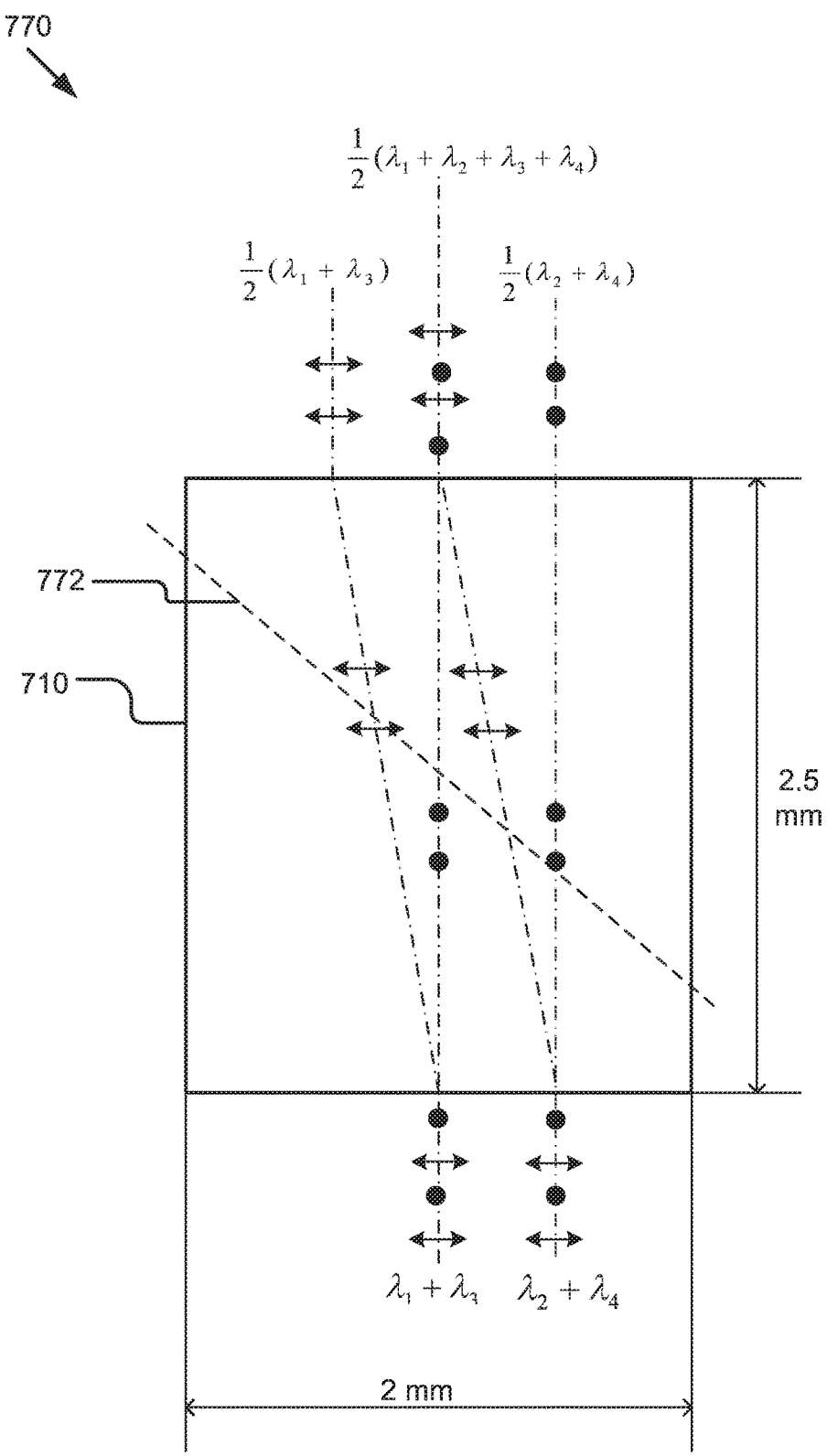
FIG. 7E is a graphic representation that illustrates example propagation paths of the light beams of FIG. 7D that propagate through a second PBS of the PMUX combiner of FIG. 7A.

FIG. 7C is a graphic representation 750 that illustrates the four light beams of FIG. 7B that propagate through the first polarization shifting assembly (e.g., the waveplates 702 and 704) and the first PBS 706, arranged in accordance with at least some embodiments described herein. A first distance between the first light beam and the second light beam, a second distance between the second light beam and the third light beam, and a third distance between the third light beam and the fourth light beam may have an equal value of 0.25 mm or another suitable distance value.

Initially, each of the first light beam, the second light beam, the third light beam, and the fourth light beam from a transmit laser assembly (e.g., the transmit laser assembly of FIG. 1A) may have a corresponding polarization state parallel to a laser top surface. The first light beam, the second light beam, the third light beam, and the fourth light beam may propagate through an isolator (e.g., the isolator 110 of FIG. 1A). The isolator may respectively rotate a first polarization state of the first light beam, a second polarization state of the second light beam, a third polarization state of the third light beam, and a fourth polarization state of the fourth light beam to be oriented at about 45° or another suitable angle relative to an incident plane of the PMUX combiner 114. FIG. 7C illustrates the first polarization state of the first light beam, the second polarization state of the second light beam, the third polarization state of the third light beam, and the fourth polarization state of the fourth light beam that orient at about 45° relative to the incident plane of the PMUX combiner 114 using slanted double-arrow hash markers 752, 754, 756, and 758, respectively. As used herein, the term "about" as applied to a value may indicate a range of ±15% of the stated value.

In some embodiments, the first waveplate 702 may be oriented at about 67.5° or another suitable angle to rotate the first polarization state of the first light beam and the second polarization state of the second light beam to an S polarization. An S polarization is illustrated using a dot along a propagation path and may be referred to as an out-of-plane polarization. The first waveplate 702 may include a half waveplate with a wavelength of 1310 nm or another suitable wavelength. The first waveplate 702 may have a dimension of 1 mm×2 mm×0.09 mm or another suitable dimension.

The second waveplate 704 may be oriented at about 22.5° or another suitable angle to rotate the third polarization state of the third light beam and the fourth polarization state of the fourth light beam to a P polarization. A P polarization is illustrated using a vertical double-arrow hash marker along a propagation path and may be referred to as an in-plane polarization. The second waveplate 704 may include a half waveplate with a wavelength of 1310 nm or another suitable wavelength. The second waveplate 704 may have a dimension of 1 mm×2 mm×0.09 mm or another suitable dimension. In some embodiments, the second waveplate 704 may have the same or similar dimension as the first waveplate 702.

Throughout the disclosure, the term "in-plane" may be referred to as in a plane of a drawing paper, while the term "out-of-plane" may be referred to as out of the plane of the drawing paper. The in-plane polarization state may be orthogonal or substantially orthogonal to the out-of-plane polarization state.

The first light beam and the second light beam with the S polarization may be reflected by coating surfaces in the first PBS 706. The third light beam and the fourth light beam with the P polarization may propagate through the first PBS 706 without reflection. The first PBS 706 may reflect the first light beam twice and combine the first light beam with the third light beam to output a first intermediate combined light beam represented by $\lambda_1+\lambda_3$. The first PBS 706 may also reflect the second light beam twice and combine the second light beam with the fourth light beam to output a second intermediate combined light beam represented by $\lambda_2\lambda_4$. The first intermediate combined light beam $\lambda_1+\lambda_3$ and the second intermediate combined light beam $\lambda_2\lambda_4$ may propagate to the third waveplate 708. The first PBS 706 may have a thickness of 0.5 mm or another value. The first PBS 706 may have a dimension of mm×2 mm×0.5 mm or another suitable dimension.

FIG. 7D is a graphic representation 760 that illustrates changes in polarization states of the four light beams of FIG. 7B caused by the second polarization shifting assembly (e.g., the third waveplate 708), arranged in accordance with at least some embodiments described herein. Before entering the third waveplate 708, the first light beam $\lambda 1$ and the second light beam $\lambda 2$ may have an S polarization while the third light beam $\lambda 3$ and the fourth light beam $\lambda 4$ may have a P polarization. The third waveplate 708 may be oriented at about 22.5° or another suitable angle to rotate polarization states of light beams that propagate through the third waveplate 708 by 45° or another suitable angle. For example, the third waveplate 708 may rotate the first polarization state of the first light beam and the third polarization of the third light beam in the first intermediate combined light beam $\lambda 1+\lambda 3$ by about 135° each. The third waveplate 708 may also rotate the second polarization state of the second light beam and the fourth polarization state of the fourth light beam in the second intermediate combined light beam $\lambda 2+\lambda 4$ by about 45 degrees each. About 50% of the total power of the four beams is in the P polarization and about 50% of the total power of the four beams is in the S polarization.

FIG. 7E is a graphic representation 770 that illustrates the four light beams of FIG. 7B that propagate through the second PBS 710, arranged in accordance with at least some embodiments described herein. An optical axis 772 of the second PBS 710 is illustrated using a dashed line. The second PBS 710 may include yttrium orthovanadate (YVO4) or another suitable material. The second PBS 710 may have a thickness of 2.5 mm or another suitable value. The second PBS 710 may have a dimension of 2 mm×2 mm×2.5 mm or another suitable dimension.

The second PBS 710 may receive the first intermediate combined light beam $\lambda 1+\lambda 3$ and the second intermediate combined light beam $\lambda 2+\lambda 4$ from the third waveplate 708. The second PBS 710 may be configured to combine the first intermediate combined light beam $\lambda 1+\lambda 3$ and the second intermediate combined light beam $\lambda 2\lambda 4$ to output the combined light beam represented by $(\lambda 1\lambda 2\lambda 3\lambda 4)/2$ and two other partially-combined light beams represented by $(\lambda 1\lambda 3)/2$ and $(\times 2\lambda 4)/2$. The combined light beam $(\lambda 1\lambda 2\lambda 3\lambda 4)/2$ may include about 50% of a total power of the four light beams. A first partially-combined light beam $(\times 1\lambda 3)/2$ may include about 50% of a power of the first intermediate combined light beam $\lambda 1+\lambda 3$, which is about 50% of a total power of the first light beam and the third light beam. A second partially-combined light beam $(\lambda 2\lambda 4)/2$ may include about 50% of a power of the second intermediate combined light beam $\lambda 2\lambda 4$, which is about 50% of a total power of the second light beam and the fourth light beam. Since only the combined light beam $(\lambda 1\lambda 2\lambda 3\lambda 4)/2$ may be focused onto an optical fiber for transmission, about 50% of the total power of the four light beams is lost. Thus, the second PBS 710 may cause a 50% power loss.

The present disclosure is not to be limited in terms of the particular embodiments described herein, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the present disclosure is not limited to particular methods, reagents, compounds, compositions, or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transmitter, comprising:
   a transmit laser assembly that includes a plurality of lasers configured to emit a plurality of light beams, each of the plurality of light beams including the same polarization state;
   a single isolator configured to rotate a corresponding polarization state of each of the plurality of light beams;
   a power multiplexing (PMUX) combiner configured to receive the plurality of light beams from the isolator and combine the plurality of light beams into a combined light beam; and
   a lens configured to focus the combined light beam onto an optical fiber for transmission.

2. The optical transmitter of claim 1, wherein the transmit laser assembly comprises:
   a ceramic carrier;
   a laser array mounted on the ceramic carrier, the laser array including the plurality of lasers configured to emit the plurality of light beams, each of the plurality of light beams initially including a corresponding polarization state parallel to a laser top surface of the laser array; and
   a lens array configured to collimate the plurality of light beams from the laser array.

3. The optical transmitter of claim 2, wherein the laser array includes a vertical-cavity surface-emitting laser (VCSEL) array that emits the plurality of light beams with a propagation direction perpendicular to the laser top surface.

4. The optical transmitter of claim 2, wherein
   the plurality of light beams have an initial propagation direction parallel to the laser top surface; and
   the transmit laser assembly further comprises a mirror mounted on the ceramic carrier and configured to redirect the propagation direction of the plurality of light beams to be perpendicular to the laser top surface.

5. The optical transmitter of claim 4, wherein the laser array includes one of a coarse wavelength division multiplexing (CWDM) laser array and a distributed feedback laser (DFB) array.

6. The optical transmitter of claim 1, wherein the transmit laser assembly and the isolator are configured within a cylindrical can structure.

7. The optical transmitter of claim 1, wherein the PMUX combiner comprises a first polarization shifting assembly that includes a first waveplate and a second waveplate, a first polarization beam splitter (PBS), a second polarization shifting assembly that includes a third waveplate, and a second PBS.

8. The optical transmitter of claim 7, wherein:
   the plurality of light beams includes a first light beam with a first wavelength, a second light beam with a second wavelength, a third light beam with a third wavelength, and a fourth light beam with a fourth wavelength;
   the isolator is configured to rotate a first polarization state of the first light beam, a second polarization state of the second light beam, a third polarization state of the third light beam, and a fourth polarization state of the fourth light beam to be oriented at about 45 degrees relative to an incident plane of the PMUX combiner, respectively;
   the first waveplate is oriented at about 67.5 degrees to rotate the first polarization state of the first light beam and the second polarization state of the second light beam to an S polarization;
   the second waveplate is oriented at about 22.5 degrees to rotate the third polarization state of the third light beam and the fourth polarization state of the fourth light beam to a P polarization;
   the first PBS is configured to reflect the first light beam twice and combine the first light beam with the third light beam to output a first intermediate combined light beam;
   the first PBS is also configured to reflect the second light beam twice and combine the second light beam with the fourth light beam to output a second intermediate combined light beam;
   the third waveplate is oriented at about 22.5 degrees to rotate the first polarization state of the first light beam and the third polarization of the third light beam in the first intermediate combined light beam by about 135 degrees and to rotate the second polarization state of the second light beam and the fourth polarization state of the fourth light beam in the second intermediate combined light beam by about 45 degrees; and
   the second PBS is configured to combine at least a portion of the first intermediate combined light beam and at least a portion of the second intermediate combined light beam to output the combined light beam.

9. The optical transmitter of claim 8, wherein:
   the first light beam has a wavelength of 1270 nanometers;
   the second light beam has a wavelength of 1290 nanometers;
   the third light beam has a wavelength of 1310 nanometers; and
   the fourth light beam has a wavelength of 1330 nanometers.

10. The optical transmitter of claim 7, wherein the second PBS comprises yttrium orthovanadate (YVO4) material.

11. The optical transmitter of claim 2, wherein the laser array includes four different coarse wavelength division multiplexing (CWDM) lasers integrated into a laser chip with a pitch between 250 micrometers and 500 micrometers.

12. The optical transmitter of claim 1, wherein the optical transmitter further comprises a lucent connector/ultra physical contact (LC/UPC) receptacle.

13. The optical transmitter of claim 1, wherein the combined light beam includes about 50% of a total power of the plurality of light beams.

14. An optical transmitter comprising:
a laser array that includes a plurality of lasers configured to emit a plurality of light beams, each of the plurality of light beams including a corresponding polarization state parallel to a laser top surface of the laser array;
a mirror configured to redirect a propagation direction of the plurality of light beams to be perpendicular to the laser top surface;
a lens array configured to collimate the plurality of light beams;
a single stage isolator configured to rotate the corresponding polarization state of each of the plurality of light beams;
a power multiplexing (PMUX) combiner configured to receive the plurality of light beams from the isolator and combine the plurality of light beams into a combined light beam; and
a lens configured to focus the combined light beam onto an optical fiber for transmission.

15. The optical transmitter of claim 14, wherein the laser array, the mirror, the lens array, the isolator, and the PMUX combiner are configured within a cylindrical can structure.

16. A power multiplexing (PMUX) combiner configured to combine a plurality of light beams into a combined light beam, the PMUX combiner comprising:
a first waveplate configured to rotate a first polarization state of a first light beam and a second polarization state of a second light beam to an S polarization;
a second waveplate configured to rotate a third polarization state of a third light beam and a fourth polarization state of a fourth light beam to a P polarization;
a first polarization beam splitter (PBS) configured to combine the first light beam with the third light beam to output a first intermediate combined light beam, the first PBS also configured to combine the second light beam with the fourth light beam to output a second intermediate combined light beam;
a third waveplate configured to rotate the first polarization state of the first light beam and the third polarization of the third light beam in the first intermediate combined light beam, the third waveplate also configured to rotate the second polarization state of the second light beam and the fourth polarization state of the fourth light beam in the second intermediate combined light beam; and
a second PBS configured to combine at least a portion of the first intermediate combined light beam and at least a portion of the second intermediate combined light beam to output the combined light beam.

17. The PMUX combiner of claim 16, wherein the first polarization state of the first light beam, the second polarization state of the second light beam, the third polarization state of the third light beam, and the fourth polarization state of the fourth light beam are oriented at about 45 degrees relative to an incident plane of the PMUX combiner before entering the PMUX combiner.

18. The PMUX combiner of claim 16, wherein:
the first waveplate is oriented at about 67.5 degrees;
the second waveplate is oriented at about 22.5 degrees; and
the third waveplate is oriented at about 22.5 degrees.

19. The PMUX combiner of claim 18, wherein:
the third waveplate is configured to rotate the first polarization state of the first light beam and the third polarization of the third light beam in the first intermediate combined light beam by about 135 degrees; and
the third waveplate is also configured to rotate the second polarization state of the second light beam and the fourth polarization state of the fourth light beam in the second intermediate combined light beam by about 45 degrees.

20. The PMUX combiner of claim 16, wherein the combined light beam includes about 50% of a total power of each of the first light beam, the second light beam, the third light beam, and the fourth light beam.

\* \* \* \* \*